(12) United States Patent
Zou et al.

(10) Patent No.: US 8,103,979 B2
(45) Date of Patent: Jan. 24, 2012

(54) SYSTEM FOR GENERATING AND OPTIMIZING MASK ASSIST FEATURES BASED ON HYBRID (MODEL AND RULES) METHODOLOGY

(75) Inventors: Yi Zou, Sunnyvale, CA (US); Luigi Capodieci, Santa Cruz, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 386 days.

(21) Appl. No.: 12/254,172

(22) Filed: Oct. 20, 2008

(65) Prior Publication Data

US 2010/0099032 A1    Apr. 22, 2010

(51) Int. Cl.
  *G06F 17/50* (2006.01)
(52) U.S. Cl. .......................................................... 716/50
(58) Field of Classification Search ................ 716/1, 21, 716/100, 50
  See application file for complete search history.

(56) References Cited

U.S. PATENT DOCUMENTS

| | | | |
|---|---|---|---|
| 6,777,146 B1 * | 8/2004 | Samuels | 430/30 |
| 6,800,406 B2 * | 10/2004 | Tejnil | 430/5 |
| 7,141,338 B2 | 11/2006 | Chen et al. | |
| 7,315,999 B2 * | 1/2008 | Melvin et al. | 716/52 |
| 7,355,673 B2 * | 4/2008 | Hsu et al. | 355/53 |
| 7,548,302 B2 * | 6/2009 | Bleeker et al. | 355/67 |
| 2004/0166418 A1 * | 8/2004 | Samuels | 430/5 |
| 2005/0028129 A1 * | 2/2005 | Hsu et al. | 716/19 |
| 2005/0076316 A1 * | 4/2005 | Pierrat et al. | 716/4 |
| 2006/0057475 A1 * | 3/2006 | Liebmann et al. | 430/5 |
| 2006/0200790 A1 * | 9/2006 | Shang et al. | 716/19 |
| 2007/0077504 A1 * | 4/2007 | Park | 430/30 |
| 2007/0273853 A1 * | 11/2007 | Bleeker et al. | 355/46 |
| 2008/0301620 A1 * | 12/2008 | Ye et al. | 716/19 |
| 2009/0271759 A1 * | 10/2009 | Torres Robles et al. | 716/19 |
| 2009/0276750 A1 * | 11/2009 | Lin et al. | 716/19 |
| 2010/0122224 A1 * | 5/2010 | Lucas et al. | 716/4 |
| 2010/0175040 A1 * | 7/2010 | Meiring et al. | 716/19 |

\* cited by examiner

*Primary Examiner* — Suchin Parihar
(74) *Attorney, Agent, or Firm* — Ditthavong Mori & Steiner, P.C.

(57) ABSTRACT

An optimal assist feature rules set for an integrated circuit design layout is created using inverse lithography. The full chip layout is lithographically simulated, and printability failure areas are determined. The features are analyzed for feature layout patterns, and inverse lithography is performed on the unique feature layouts to form assist features. The resulting layout of assist features is analyzed to create an assist feature rules set. The rules can then be applied to a photomask patterned with the integrated circuit design layout to print optimal assist features. The resulting photomask may be used to form an integrated circuit on a semiconductor substrate.

13 Claims, 6 Drawing Sheets

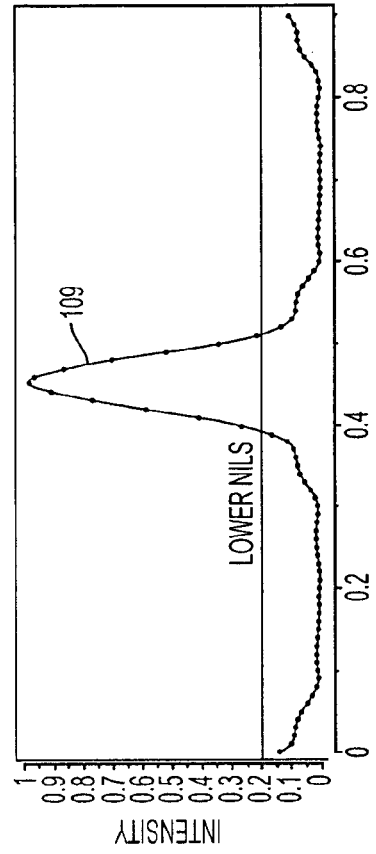
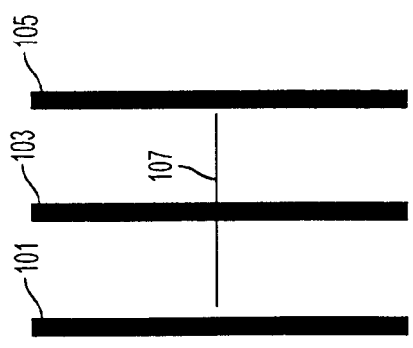
FIG. 1A
FIG. 1B
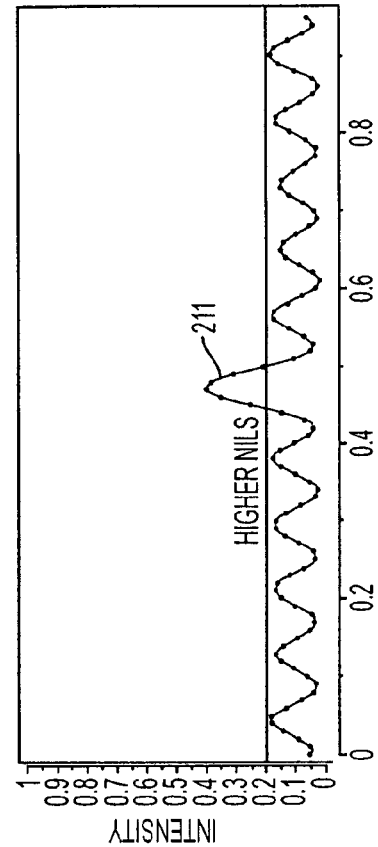
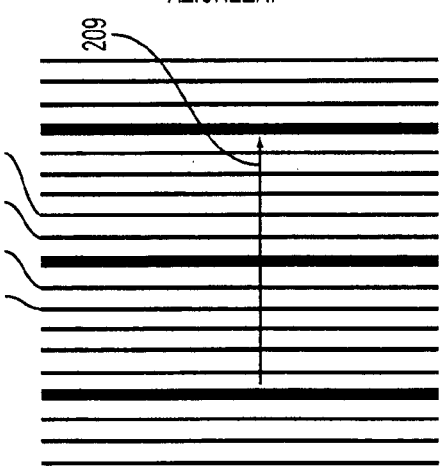
FIG. 2A
FIG. 2B

SYSTEM FOR GENERATING AND OPTIMIZING MASK ASSIST FEATURES BASED ON HYBRID (MODEL AND RULES) METHODOLOGY

BACKGROUND

The present disclosure relates to semiconductor integrated circuit manufacturing, and more specifically to optimizing mask assist features for a lithographic mask for printing a silicon wafer design layout layer.

Photolithographic masks are used to fabricate semiconductor devices such as integrated circuits. The masks are patterned according to the images that are to be printed on a silicon wafer, for example. Light is transmitted through the openings in the mask and focused onto a photoresist layer that has been coated on the silicon wafer. The transmitted and focused light exposes portions of the photoresist. A developer is used to remove either the exposed portions or the unexposed portions of the resist layer, depending on whether the photoresist is a positive or negative type resist. The remaining photoresist serves to protect the underlying layer during further processing of the wafer (e.g., etching exposed portions of the underlying layer, implanting ions into the wafer, etc.). After the wafer fabrication process for this pattern is performed, the remaining portion of the photoresist layer can be removed from the underlying substrate. The pattern that is printed onto the photoresist correlates with that of the photolithographic mask.

There is a continuing objective to increase the density with which various integrated circuit structures are arranged. As technology nodes decrease, the critical dimension of the features to be printed on the silicon wafer is reduced. As the size of the features becomes smaller than the wavelength of light, distortions occur in the printed patterns. To reduce these distortions, mask assist features (AF) are added to the mask between the features to be printed. AF are not printed on the semiconductor wafer, but help to balance the optical density of the feature pattern.

AF are special geometrical figures, or polygons, which are added (or sometimes subtracted) to design layouts in lithographic processes for manufacturing integrated circuits and other related fields such as hard-disk heads, etc. AF are also referred to as sub-resolution assist features (SRAF), scatter bars (SB), and in some cases printable assist features (PRAF), but the more general term, AF, will be used throughout this disclosure. Given a design layout representing a circuital layer, AF figures are created with specified dimensions (widths, heights, etc.) and at specified distances (placements relative to the main features of the circuit). The number of AF per given layout feature, the set of AF dimensions, and the distances from the main features are collectively referred to as the AF rules set.

AF improve process latitude, or the change in critical dimension for a given change in exposure dose. For a given target pattern, if chosen properly, the AF balance the optical density such that the variation in intensity across the features to be printed is reduced. The parameter values in an AF rules set depend on several technology and process conditions. For example, the critical dimensions (CD) of the layout features, lithography wavelength and illumination, and mask type all affect the parameter values. Identifying optimal parameter values in an AF rules set (or optimal AF rules, for short) is a fundamental problem in process technology development for semiconductor manufacturing.

Currently, AF generation is performed by using a combination of lithographic simulations and silicon verification with test masks and test chips, from which AF rules are derived. A set of layout geometrical configurations (typically one dimensional lines and space structures of different sizes and pitches) is selected, and then a large combinatorial set of AF numbers, widths, and distances are evaluated by lithographic simulations, followed by validation of mask fabrication constraints. Various objective functions are used for this evaluation based on manufacturability metrics (for instance, normalized image log slope, focus and exposure latitude, etc.). Experimental verification on silicon is often used on a subset of candidate AF rules values. This process is cumbersome, computationally very expensive, and error-prone, which often results in a set of sub-optimal rules.

As the technology node and target feature CD are reduced, the complexity of the AF rules optimization increases. A need therefore exists for a more accurate AF generation process with fewer computations.

DISCLOSURE

The above described needs are fulfilled, at least in part, by first simulating a full integrated circuit chip layout lithographically and identifying printability failure points. The target features are then analyzed for patterns, and the patterns are classified. Unique layout configurations are extracted, and a set of unique layout configurations is selected. The selected layout configuration may include 1, 1.5, and 2-dimensional elements.

Given the selected layout configurations, a mask including the target features of the selected layout configurations and corresponding assist features is generated by inverse lithography. The generated assist features are then analyzed to create an optimal assist feature rules set. The assist feature shapes, sizes, and distances from the target features of the layout configuration are analyzed using a geometrical scan line analysis and a pattern classification reduction of the generated assist features.

The above described needs are further fulfilled by forming an integrated circuit using the optimal assist rules set. Target features of the integrated circuit are patterned to form a lithographic mask. Assist features are then formed on the mask in accordance with the optimal assist feature rules set. A resist is formed on a semiconductor wafer and is exposed by focusing light through the lithographic mask. Then the resist is developed to remove either the exposed or the unexposed portions depending on whether the resist is a positive or a negative resist. The integrated circuit is formed on the semiconductor wafer using the patterned resist.

A light source may be configured to expose portions of a photoresist according to an integrated circuit design and a substrate underlying the photoresist is etched according to the exposed photoresist pattern. A processor is configured to perform inverse lithography on the integrated circuit design layout to create an optimal assist feature rules set and to print assist features on the etched substrate according to the created assist feature rules.

Still other aspects, features, and advantages will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings, in which like reference numerals refer to similar elements and in which:

FIG. 1a is a simple photolithographic mask;

FIG. 1b is a graph of the intensity across the mask of FIG. 1a;

FIG. 2a is the photolithographic mask of FIG. 1a with assist features;

FIG. 2b is a graph of the intensity across the mask of FIG. 1b;

DETAILED DESCRIPTION

Figure 3:
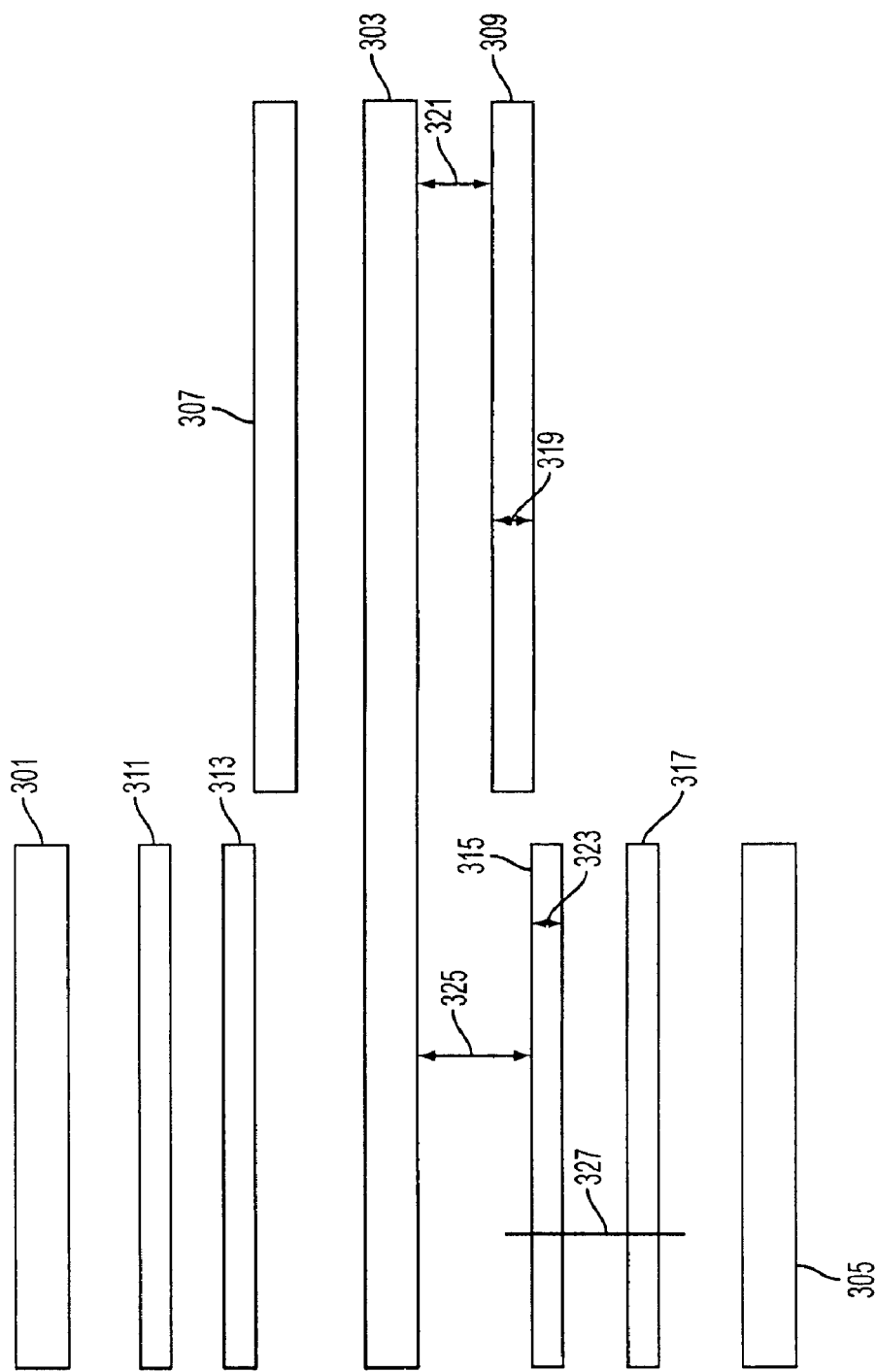
FIG. 3 shows assist feature rule parameters.

FIG. 1a is a photolithographic mask with a simple layout configuration for an integrated circuit. The layout includes target features 101, 103, and 105, or elements to be printed on a semiconductor wafer. The rectangular shape of the three target features is merely exemplary, as target features for an integrated circuit may be any shape and size. FIG. 1b shows the variation in intensity across cutline 107 of FIG. 1a. As indicated by curve 109 in FIG. 1b, with no AF in the mask, the variation in intensity across the x-dimension of the layout configuration is significant near the target features. Such a high variation in intensity causes optical distortions when the mask is used for photolithographic processes.

FIG. 2a is the same photolithographic mask of FIG. 1b with AF such as 201, 203, 205, and 207. Like the target features, AF may be different sizes and shapes, and those shown are merely exemplary. FIG. 2b shows the variation in intensity across cutline 209 of FIG. 2a. As indicated by curve 211, small variations in intensity exist near each AF, and the variation in intensity near the target features is significantly reduced. Thus, the optical density of the pattern is much more balanced with AF than without.

FIG. 3 is another exemplary photolithographic mask with AF. Two different types of AF are shown in between target features 301, 303, and 305. A first type (elements 311, 313, 315, and 317) is short and narrow, whereas the second type (element 309) is longer and wider. The width 319 of AF 309 and distance 321 between target feature 303 and AF 309 are AF rule parameters for AF 309. Similarly, width 323, distance 325 between target 303 and AF 315, and number 327 of AF between targets 303 and 305 are AF rule parameters for AF 315 and 317. The AF rule parameters may also include shape, length, and orientation relative to target features. The optimal sizes, shapes, orientations, and placements of the AF for a given layout of target features are the ones which produce the most balanced optical density of the pattern and, thus, the best process latitude. All of the AF rule parameters for a particular target feature pattern form the AF rules set for that pattern.

Figure 4:
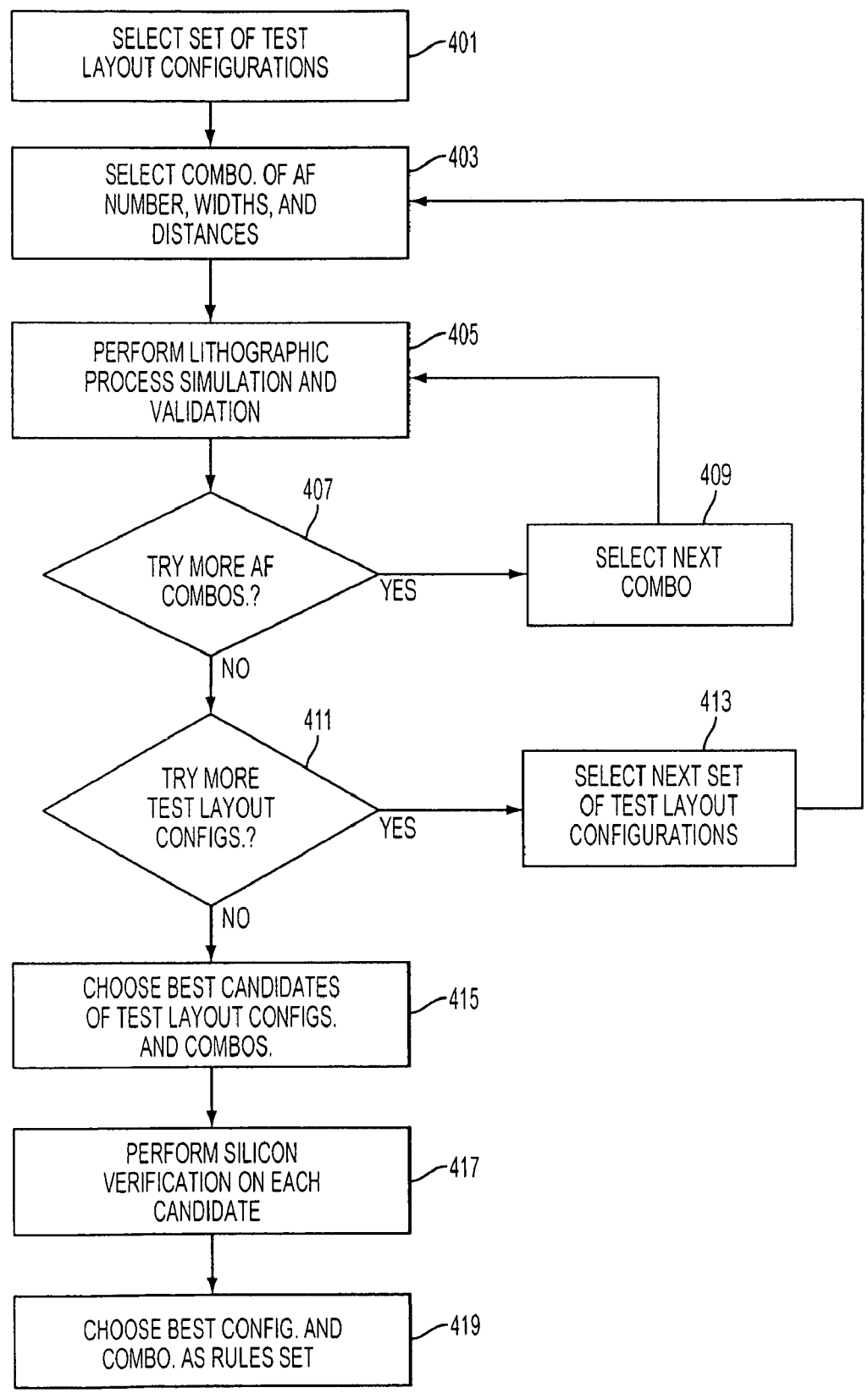
FIG. 4 is a flowchart of the prior art process for optimizing AF rules.

FIG. 4 illustrates a prior art process for optimizing AF rules. As shown in FIG. 4, the prior art process begins at step 401 with selecting a set of layout configurations of AF for a given integrated circuit pattern. In other words, particular shapes and general placements of AF are chosen. Referring to FIG. 3, the layout configuration selected would be one or more rectangular AF between target features 301 and 303, between target features 303 and 305, and on each side of target feature 303 where there is no adjacent target feature. The AF are generally one dimensional but may vary in width, number, and distance from the target pattern.

At step 403 a first combination of AF widths, numbers, and distances from target features is selected. Referring again for FIG. 3, two AF with width 323 a distance 325 from 303 are selected between 301 and 303 and between 303 and 305, and one AF with width 319 at a distance 321 from 303 are selected near 303 where there is no adjacent target feature. Another combination might have different AF widths and/or different AF numbers, etc.

Lithographic process simulation and validation for the first combination of AF widths, numbers, and distances from target features takes place at step 405. Normalized image log slope, focus and exposure latitude, for example, are evaluated. This evaluation is to determine which combination would be a good candidate for the mask for the target integrated circuit pattern.

If it is determined that there are more viable combinations for the initial AF layout configuration at step 407, another combination is selected (step 409) and the process returns to step 405 for an evaluation of the new combination of AF widths, numbers, and distances from target features. When no more viable combinations are available at step 407, a determination is made at step 411 as to whether other layout configurations of AF are viable. If so, the next set of layout configurations is selected at 413 and the process returns to step 403 to select and test each combination of AF widths, numbers, and distances from target features for the new layout configuration. This loop continues through all viable AF layout configurations. In the current state of the art the practical set of layout configurations for AF rules optimization is limited to fewer than 25 (and only one dimensional).

Once all evaluations are completed, the best candidate AF configurations and combinations are selected at step 415, and silicon verification is performed on each candidate at step 417. The best candidate, based on which particular combination produces the minimum variability of the main features, is then selected (step 419) as the AF rules set for the target pattern. As illustrated in FIG. 4, the prior art process is iterative, with significant trial and error of different AF configurations with different AF widths, numbers, and distances.

Figure 5:
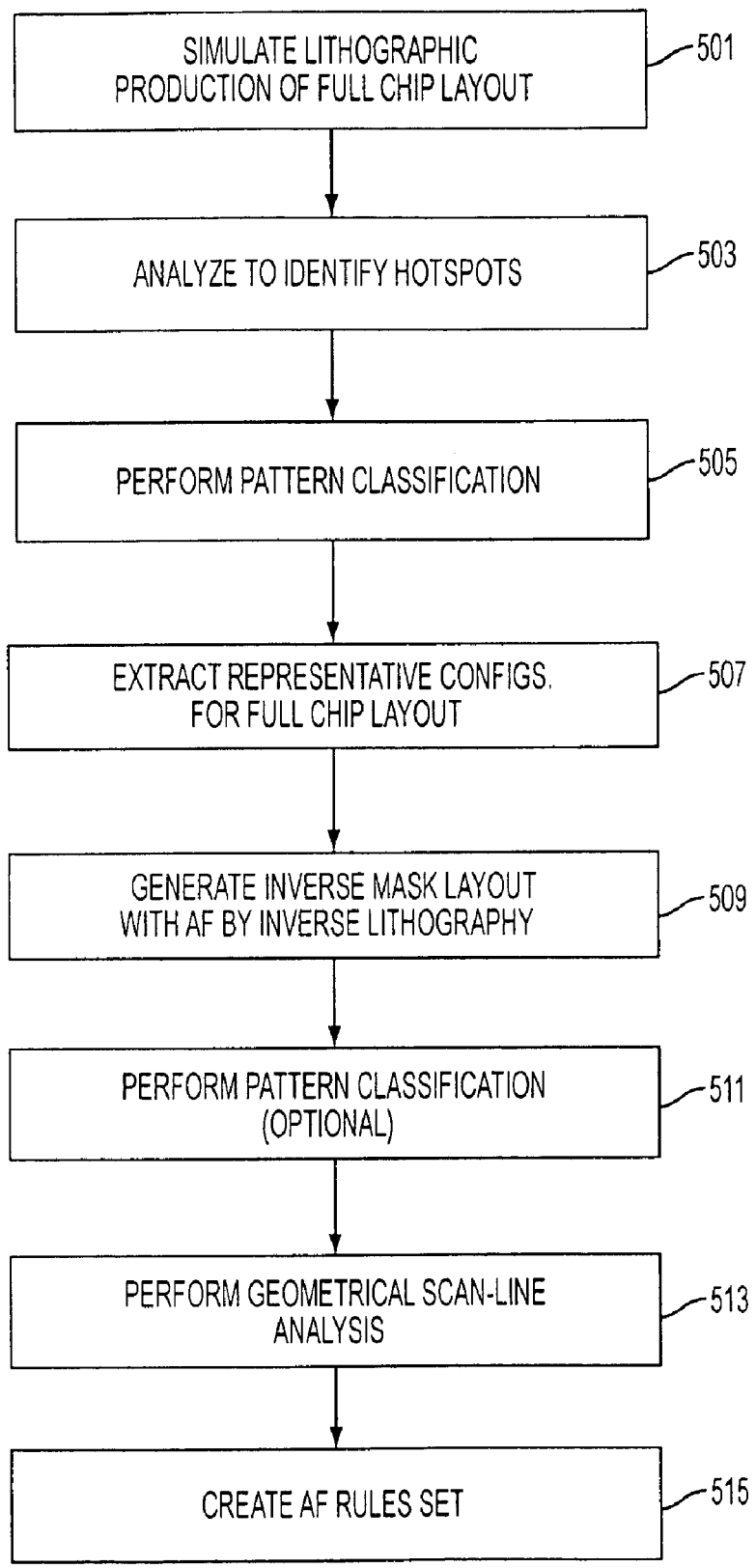
FIG. 5 is a flowchart of a process for optimizing AF rules, according to an exemplary embodiment.

FIG. 5 is a flowchart of a process of optimizing AF rules according to an exemplary embodiment of the present disclosure. The process begins at step 501 by simulating a lithographic production of a full chip layout. The layout is analyzed lithographically at step 503 to identify printability failure points, or hot spots. The hot spots represent the areas where the presence of mask assist features could improve process latitude and or other manufacturability metrics. These areas are analyzed for layout configuration patterns, and the patterns are classified (step 505). Pattern classification is accomplished by breaking down layout configurations into clusters of layout shapes based on geometrical similarity criteria. Unique patterns are extracted, and duplicate patterns are eliminated. These unique layout patterns are selected as representative layout configurations for the full chip layout at step 507. The selected layouts may be 1, 1.5, and 2-dimensional, as opposed to prior art processes in which only 1-dimensional layout configurations were used in generating AF rules.

The selected layout configurations are then subjected to inverse lithography at step 509. Inverse lithography may be implemented many different ways. For example, inverse lithography can create a fully pixilated mask with variable transmission and phase pixels. Alternatively, it can create masks which mimic optical proximity correction. Step 509 of the present disclosure makes use of any inverse lithography technique which can be constrained to generate new mask features (from which final AF are then selected) without substantially altering the shapes of the original layout, except possibly for sizing. Step 509 results in an inverse mask including the selected layout configurations and corresponding optimal AF configurations for each.

The AF configurations that result from the inverse lithography may be analyzed for patterns and the patterns classified at step 511. The unique patterns may be extracted and analyzed using a geometrical scan-line analysis at step 513. Step 511 is optional. Analyzing only unique patterns simplifies and expedites the succeeding scan-line analysis. However, this step may be eliminated and all of the AF configurations generated by the inverse lithography may be analyzed at step 513. The geometrical analysis determines sizes, numbers, and distances from target features for each AF configuration. The data produced from the analysis is compiled to create an optimal AF rules set.

Figure 6:
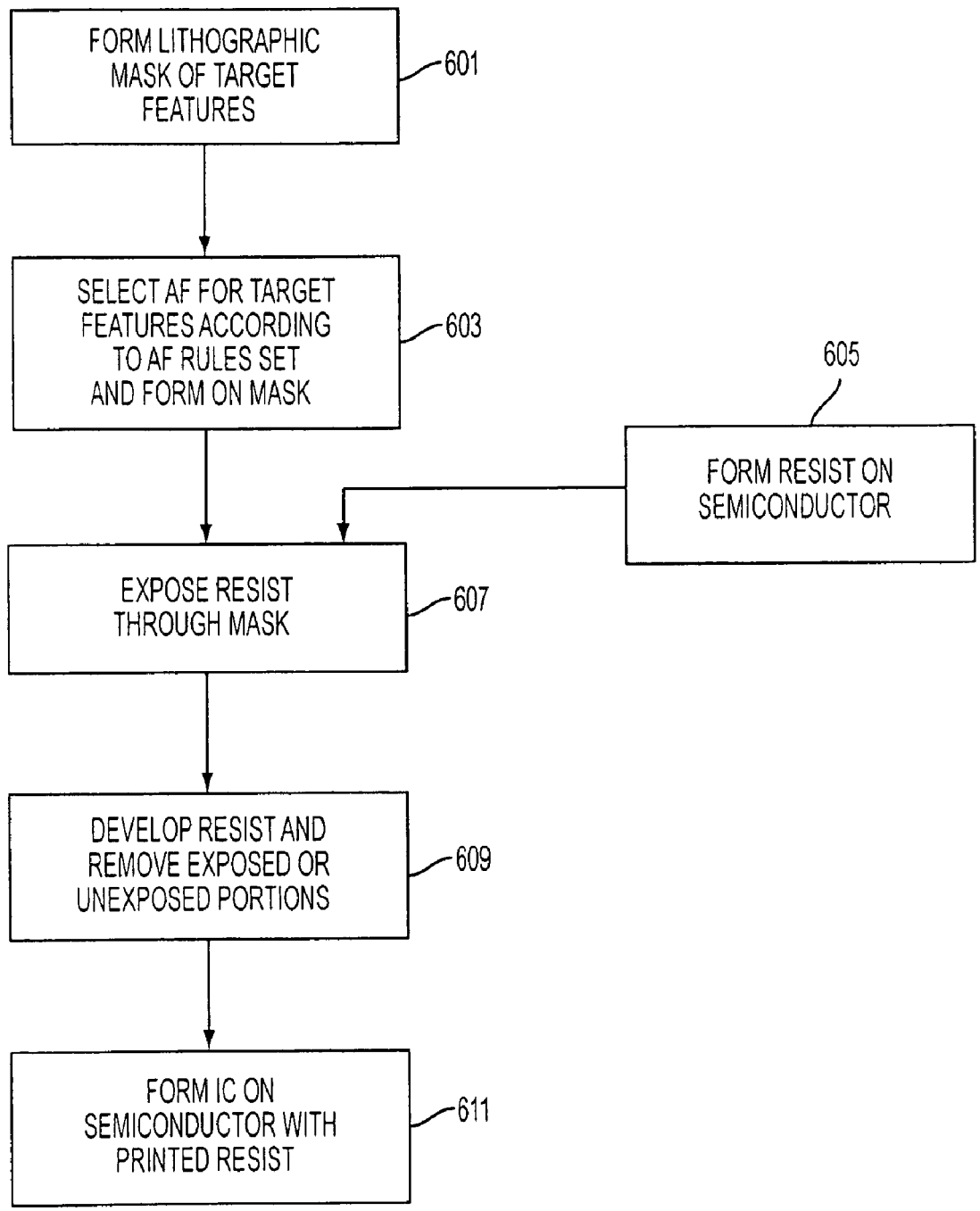
FIG. 6 is a flowchart of a process for forming an integrated circuit, according to an exemplary embodiment.

FIG. 6 is a flowchart of a process for forming an integrated circuit using the optimal AF rules set created by the process of FIG. 5. At step 601 target elements of the integrated circuit are formed on a lithographic mask. AF are selected at step 603 based on the layout configurations of the target features according to the optimal AF rules set. The selected AF are printed on the lithographic mask. A photoresist is formed on a semiconductor wafer at step 605. The photoresist is exposed to light that is focused through the lithographic mask at step 607 and developed at step 609. If the photoresist is a positive type resist, the exposed portions are removed at step 609. If the photoresist is a negative type resist, the unexposed portions are removed at step 609. The remaining portions of the photoresist have the pattern of the target features from the lithographic mask. These portions protect the underlying semiconductor during further processing of the semiconductor to form the integrated circuit at step 611.

Figure 7:
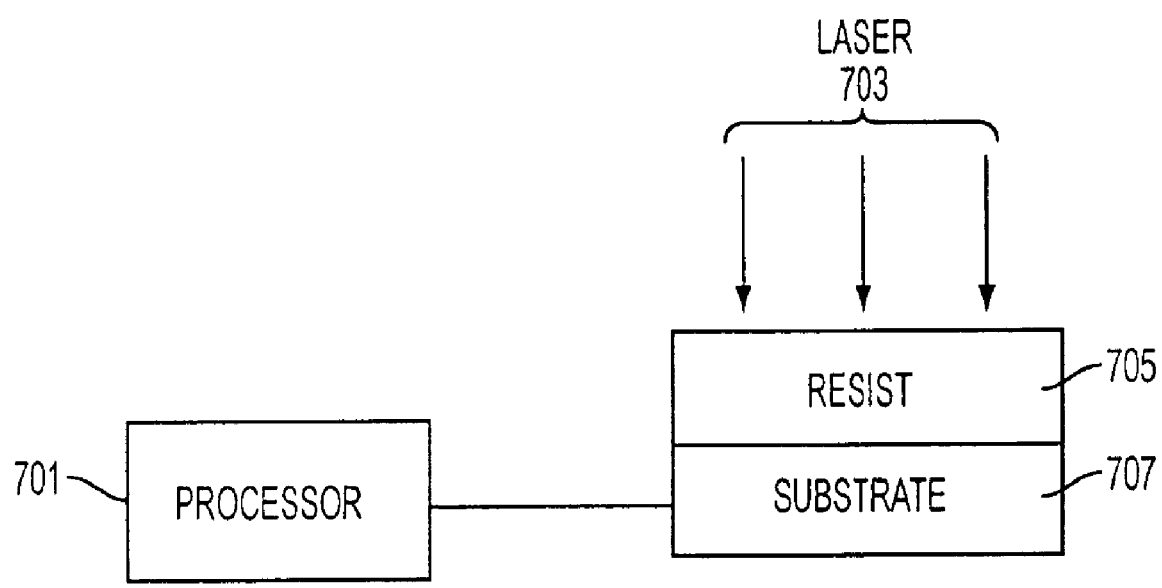
FIG. 7 is an apparatus for forming a photomask for an integrated circuit, according to an exemplary embodiment.

FIG. 7 is an apparatus for forming a photomask for an integrated circuit, according to an exemplary embodiment. The apparatus includes a processor 701 configured to perform inverse lithography according to the process of FIG. 5 on an integrated circuit design layout. The result of the inverse lithography is a optimal AF rules set for the integrated circuit design. The apparatus further includes a light source 703, such as a laser. Light source 703 exposes portions of resist 705 to pattern the resist to have the integrated circuit design layout. Resist 705 is developed, and the resulting pattern is used to etch an underlying substrate 707 to form a pattern according to the integrated circuit design. Processor 701 is further configured to print optimal AF according to the optimal AF rules set on the patterned substrate to form a photomask for producing an integrated circuit with the original integrated circuit design layout.

In this disclosure there are shown and described only preferred embodiments and but a few examples of its versatility. It is to be understood that the disclosure is capable of use in various other combinations and environments, such as in other manufacturing fields such as hard-disk heads, and is capable of changes or modifications within the scope of the inventive concept as expressed herein.

What is claimed is:

1. A method comprising:
    selecting representative layout configurations of target features for an integrated circuit chip layout configuration, by:
        lithographically simulating a full chip layout,
        identifying printability failure points,
        selecting a layout configuration around each printability failure point,
        generating, by a processor, by inverse lithography a mask of the representative layout configurations and one or more assist features for the representative layout configurations, and
        analyzing the generated assist features to create an assist feature rules set.

2. The method as recited in claim 1, wherein the step of selecting representative layout configurations further comprises the step of:
    performing pattern classification of the printability failure points.

3. The method as recited in claim 2, wherein the step of selecting representative layout configurations further comprises the step of:
    extracting unique layout configurations.

4. The method as recited in claim 1, wherein the selected representative layout configurations include 1, 1.5, and 2-dimensional elements.

5. The method as recited in claim 1, wherein the step of analyzing comprises the step of:
    performing a geometrical scan line analysis of the generated assist features.

6. The method as recited in claim 5, wherein the step of analyzing further comprises the step of performing a pattern classification reduction of the generated assist features.

7. The method as recited in claim 1, wherein the step of analyzing comprises analyzing shapes, sizes, and distances from the target features of the representative layout configurations.

8. The method as recited in claim 1, further comprising the steps of:
    forming a lithographic mask comprising target features of an integrated circuit, and
    forming on the lithographic mask assist features in accordance with the optimal assist feature rules set.

9. The method as recited in claim 8, further comprising the steps of:
    forming a resist on a semiconductor wafer, and
    focusing light through the lithographic mask and assist features onto the resist to expose the resist.

10. The method as recited in claim 9, further comprising the step of:
    developing the resist to remove the exposed portions of the resist for a positive resist.

11. The method as recited in claim 10, further comprising the step of:
    forming the integrated circuit.

12. The method as recited in claim 10, further comprising the step of:
    developing the resist to remove the unexposed portions of the resist for a negative resist.

13. The method as recited in claim 12, further comprising the step of:
    forming the integrated circuit.

* * * * *